(12) United States Patent
Vaillant

(10) Patent No.: US 9,442,296 B2
(45) Date of Patent: Sep. 13, 2016

(54) DEVICE AND METHOD FOR DETERMINING OBJECT DISTANCES

(75) Inventor: Jérôme Vaillant, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 1300 days.

(21) Appl. No.: 13/334,082

(22) Filed: Dec. 22, 2011

(65) Prior Publication Data

US 2012/0162391 A1 Jun. 28, 2012

(30) Foreign Application Priority Data

Dec. 24, 2010 (FR) ...................................... 10 61237

(51) Int. Cl.
*G02B 6/02* (2006.01)
*G02B 27/22* (2006.01)
*H01L 27/146* (2006.01)
*H04N 13/02* (2006.01)

(52) U.S. Cl.
CPC ...... *G02B 27/2214* (2013.01); *H01L 27/14627* (2013.01); *H04N 13/0232* (2013.01)

(58) Field of Classification Search
CPC .................................................. G02B 27/2214
See application file for complete search history.

(56) References Cited

U.S. PATENT DOCUMENTS

| 9,048,153 B2 * | 6/2015 | Vaillant .................. G01C 3/085 |
| 2005/0285966 A1 | 12/2005 | Bamji et al. |
| 2008/0080028 A1 * | 4/2008 | Bakin .................... G06T 1/0007 |
| | | 358/514 |
| 2009/0225217 A1 | 9/2009 | Katsuda et al. |
| 2010/0033611 A1 | 2/2010 | Lee et al. |
| 2010/0059844 A1 | 3/2010 | Tanaka |
| 2010/0259648 A1 | 10/2010 | Iijima et al. |

FOREIGN PATENT DOCUMENTS

| EP | 0645659 A2 | 3/1995 |
| EP | 0981245 A2 | 2/2000 |
| WO | WO 9926419 A1 | 5/1999 |

OTHER PUBLICATIONS

French Search Report and Written Opinion dated Jul. 28, 2011 from corresponding French Application No. 10/61237.
French Search Report and Written Opinion dated Jul. 8, 2011 from related French Application No. 10/61073.

* cited by examiner

*Primary Examiner* — James Pontius
(74) *Attorney, Agent, or Firm* — Gardere Wynne Sewell LLP

(57) ABSTRACT

An integrated image sensor capable of determining the distance to objects contained in a scene, including a pixel array, each pixel in the array being associated with a microlens and being formed of an assembly of sub-pixels, each including a photosensitive area.

27 Claims, 2 Drawing Sheets

DEVICE AND METHOD FOR DETERMINING OBJECT DISTANCES

CROSS REFERENCE TO RELATED APPLICATIONS

This application claims the priority benefit of French patent application number 10/61237, filed on Dec. 24, 2010, entitled THREE-DIMENSIONAL IMAGE SENSOR, which is hereby incorporated by reference to the maximum extent allowable by law.

BACKGROUND

1. Technical Field

Embodiments relate to a three-dimensional integrated image sensor providing information as to the distance to objects contained in a scene. More specifically, the embodiments relate to such a sensor capable of detecting objects at macroscopic distances.

2. Discussion of the Related Art

"Three-dimensional (3D) macroscopic image sensor" here designates image sensors enabling to measure the remoteness of objects located at distances greater than approximately one centimeter.

Many techniques for acquiring three-dimensional images and obtaining information relative to the distance to objects are known. Among these, stereo vision techniques provide, to obtain a 3D rendering of an image, performing two acquisitions of a same scene by means of two cameras placed at distant points. The two images acquired by the two cameras are then modified by being applied, for example, a color filter, and then combined. For the reading of the image, two color filters, each capable of filtering one of the two initial images, are placed before a person's eyes. The human brain combines the two images seen by the person's two eyes and reconstructs the initial three-dimensional image.

Using this technique to perform an automated mapping of the distance to objects contained in a scene (stereoscopic method) is relatively complex. Indeed, to perform such a mapping, the two cameras should be perfectly aligned with the objects contained in the scene, and a system for decoding the complex data should be used to obtain information as to the remoteness of the objects. It is thus difficult to manufacture mobile devices using this method.

Another method for determining the distance to an object is known as the TOF method ("Time of Flight"). This method, especially used in aeronautics, comprises sending a wave, for example, a light or acoustic wave, towards an object and calculating the time taken by the wave to travel to the object and back. This method is, however, not adapted to the measurement of short distances. Indeed, in this case, the time taken by the wave to travel to the object and back is too short to be easily detected by a sensor and does not enable to accurately determine close distances. Further, this method is not compatible with the performing of an instantaneous mapping of distances to objects. Indeed, such an instantaneous determination would require the transmitted wave to have a very high power to reach an extensive area of the image, which is incompatible with the forming of portable devices.

The use of triangulation methods in which a laser scans a scene to obtain the distance of objects from this scene is also known. However, such methods are only accurate if the scene is not moving: they need too long a response time to acquire information corresponding to a moving scene.

Thus, most known solutions require transceiver system which should be accurately aligned, an active light source, and/or necessitate long response times.

SUMMARY

An embodiment aims at an image sensor enabling to determine the distance to objects contained in a scene, having a low response time and overcoming all or part of the disadvantages of prior art sensors.

Thus, an embodiment provides an integrated image sensor capable of determining the distance to objects contained in a scene, comprising a pixel array, each pixel in the array being associated with a microlens and being formed of an assembly of sub-pixels each comprising a photosensitive area, and means for determining the ratios between the amount of photons detected by a central sub-pixel of the pixels and the amount of photons detected by at least one peripheral sub-pixel of the pixels.

According to an embodiment, each pixel comprises at least one central sub-pixel and eight peripheral sub-pixels.

According to an embodiment, the sensor further comprises means for calculating the diameters of the images detected by each of the pixels based on the ratios of the amount of photons detected by a central sub-pixel of the pixels to the amount of photons detected by at least one peripheral sub-pixel of the pixels.

According to an embodiment, the sensor further comprises means for calculating the distance to objects in the scene based on the diameters of the images detected by each of the pixels.

According to an embodiment, the sensor comprises a main lens extending on the entire surface of the image sensor, the microlenses being placed in the focal plane of the main lens, the photosensitive areas of the sub-pixels being provided in the focal plane of the microlenses, the means for calculating distance $z_0$ to objects in the scene being provided to calculate the following ratio:

$$z_0 = \frac{f_L}{1 + \frac{D_{LENSE}}{f_L} \times \frac{f_\mu}{B}},$$

$D_{LENSE}$ being the diameter of the main lens and $f_L$ being its focal distance, $f_\mu$ being the focal distance of the microlenses, and B being the diameter of the image formed on a pixel of the image sensor.

According to an embodiment, the sensor further comprises means for comparing the diameters of the images detected by the pixels with reference diameters stored in a database and associated with distances to objects.

According to an embodiment, each sub-pixel comprises a single-photon avalanche diode.

An embodiment further provides a method for determining the distance to objects contained in a scene by means of an integrated image sensor such as defined hereabove, comprising the steps of: determining, for all the sensor pixels, the ratio of the amount of photons detected by a central sub-pixel to the amount of photons detected by the peripheral sub-pixels, whereby the diameter of the images formed on the pixels can be deduced; and associating the diameters of the images formed on the pixels with distances to objects in the scene.

According to an embodiment, the association of the diameters of images formed on the pixels with distances to objects in the scene is performed by comparing the diameters with diameters stored in a database.

According to an embodiment, the association of the diameters of images formed on the pixels with distances to objects in the scene is performed by calculation.

The foregoing and other objects, features, and advantages will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of image sensors, the various drawings are not to scale.

DETAILED DESCRIPTION

Figure 1:
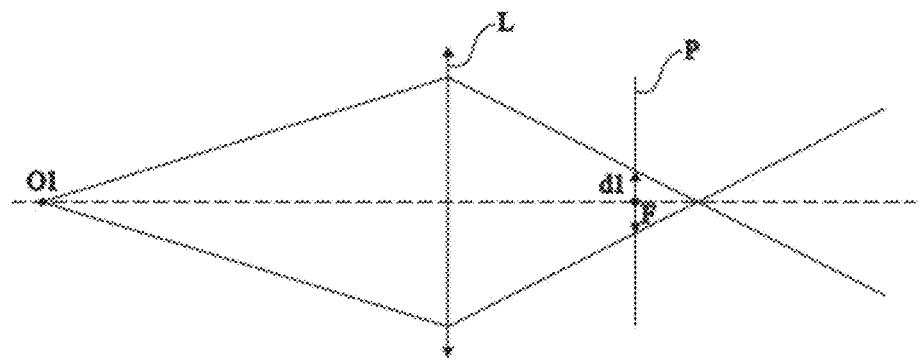
FIGS. 1 and 2 show optical systems illustrating the basic principle of an image sensor according to an embodiment.
Figure 2:
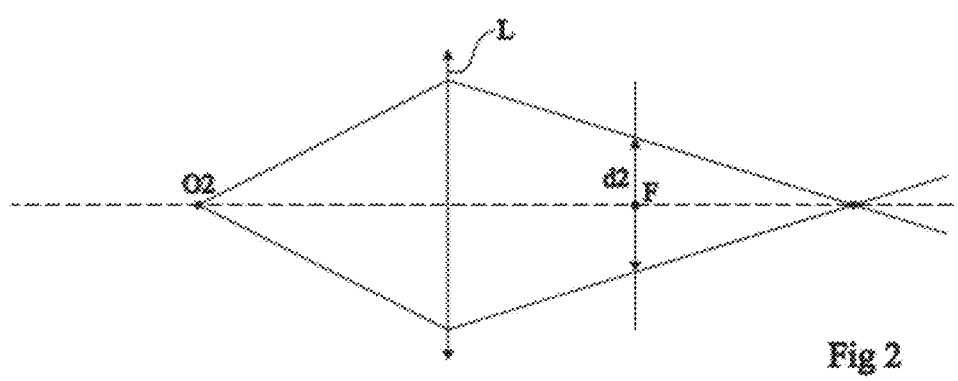

FIGS. 1 and 2 show two optical systems illustrating the basic principle of an image sensor according to an embodiment.

These drawings show an optical device comprising a converging lens L. The focal point of the lens is called F and its focal plane is called P.

In FIG. 1, an object O1 is placed on the optical axis of the lens at a first distance from said lens, greater than its focal distance. In focal plane P of the lens, object O1 forms an image having a dimension which varies according to the angular opening of the lens.

In FIG. 2, an object O2 is placed on the optical axis of lens L at a second distance from it, shorter than the first distance separating the lens and object O1. The image formed by object O2 in the focal plane of the lens has a diameter d2 in FIG. 2, greater than diameter d1 of the image of object O1 of FIG. 1.

Thus, according to the distance of an object to the lens, this object forms an image of variable size in the focal plane of the lens. The distance of an object to the lens can thus be associated with the size of the image formed by this object on the focal plane of the lens.

It should be noted that the observations relative to the diameters of the images obtained in the focal plane of lens L may also be obtained in planes different from the focal plane, according to the range of object distances which are desired to be detected.

It is provided to take advantage of these properties to form an image sensor providing information as to the distance of objects contained in a scene in integrated fashion, by measuring the size of the spot introduced by the objects in an image plane.

Figure 3A:
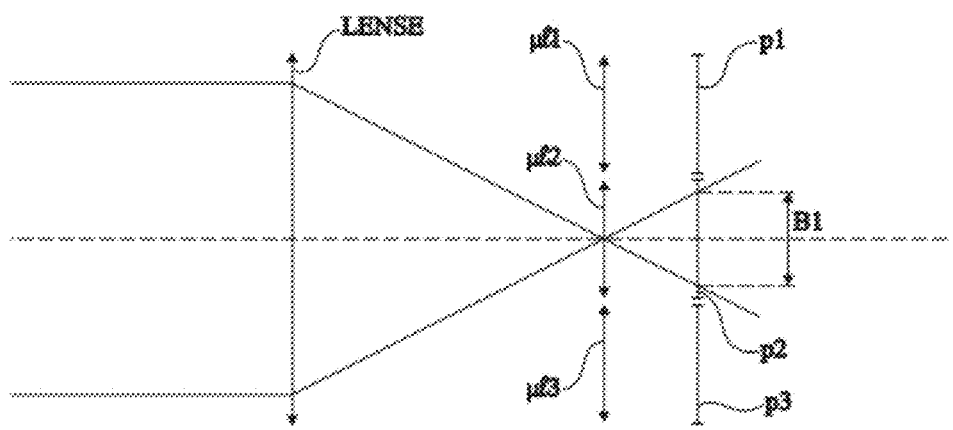
FIGS. 3A and 3B illustrate the operation of an image sensor according to an embodiment.
Figure 3B:
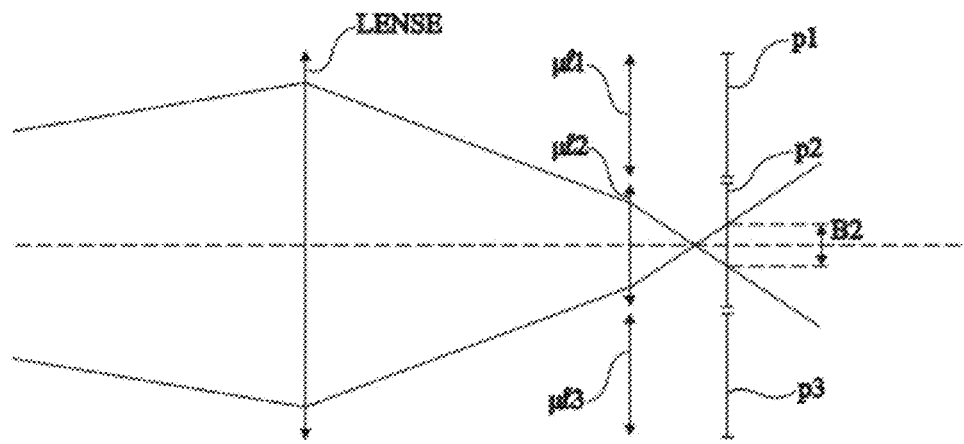

FIGS. 3A and 3B illustrate the operation of an image sensor provided on detection, respectively, of an object located at an infinite distance and of an object located at a finite distance from the image sensor.

The integrated image sensor comprises an assembly of pixels p1, p2, p3 associated, respectively, with microlenses µ11, µ12, and µ13. A main lens of the image sensor, LENSE, is provided above the microlens assembly. Microlenses µ11, µ12, and µ13 are placed at the focal plane of the main lens.

In the case of FIG. 3A, the image of the object at an infinite distance is focused by main lens LENSE towards the center of a microlens µ12. The beam originating from microlens µ12 then reaches a photodetection area of pixel p2, and forms a spot having a clear outline and a diameter B1 in this photodetection area.

In the case of FIG. 3B, the detected object is at a finite distance from main lens LENSE. The image of the object reaches microlens µ12 and the photodetection area of pixel p2, with a different incidence than in the case of FIG. 3A. The spot formed by the object in pixel p2 has a diameter B2 smaller than diameter B1, and a clear outline.

To determine the size of the image formed by objects at the level of the photodetection areas, and thus the distance to these objects, it is provided to form pixels, associated with a microlens, each comprising an array of sub-pixels. By studying the ratio between the response of a central sub-pixel and the response of one or of several peripheral sub-pixels of each pixel, the size of the image detected by the pixel (diameter), and thus the distance to the object detected by the pixel, can be deduced.

Thus, each microlens µ11, µ12, µ13 performs a sampling of the complete image detected by the sensor. Microlenses µ11, µ12 and µ13 are small enough, compared to the size of the entire sensor, to sample a uniform zone of the image, even if the complete image is blurred. Locally, the spot formed on each sensor p1 to p3 is sharp and presents a clear outline in each sub-pixel. It is thus possible to determine locally the diameter of the spot on each pixel, by comparing the ratio between the response of a central sub-pixel and the response of one or of several peripheral sub-pixels, by simple geometrical rules. The diameter is then used to determine a distance to the objects, as described below.

Figure 4:
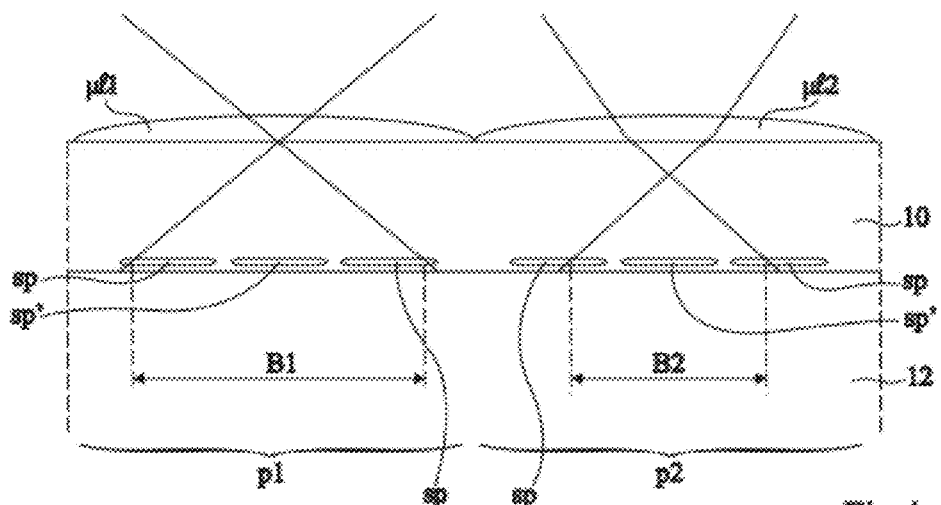
FIG. 4 illustrates a portion of an image sensor according to an embodiment.

FIG. 4 illustrates a portion of an image sensor such as described hereabove, in the case of a back-side illuminated sensor.

The sensor comprises a thinned substrate 10. Photodetection areas sp, sp' defining sub-pixels of the distance sensor are formed on the side of a first surface, that is, the front surface. Elements for transferring photogenerated charges, not shown, are formed on the front surface side of substrate 10 to transfer the charges stored in the different photodetection areas sp, sp'. An interconnection stack 12, not shown in detail, is formed above the front surface of semiconductor substrate 10. Interconnection stack 12 may comprise metal tracks and vias separated by an insulating material.

Microlenses µ11 and µ12 are formed on the second surface of substrate 10, that is, the rear surface, and define pixels p1 and p2. A transparent layer (silicon oxide, transparent resin, or other) used to space apart the substrate microlenses may be arranged before forming of the microlenses. Each microlens µ11 and µ12 is formed at the surface of an assembly of nine sub-pixels sp, sp' distributed in a square.

In the shown example, pixel p1 detects an object located at an infinite distance. The beam arriving at the surface of sub-pixels sp, sp' of pixel p1 thus has a maximum diameter B1 and reaches sub-pixels sp located at the periphery of pixel p1 on a significant surface area of these sub-pixels. Pixel p2 detects an object located at a finite distance from the sensor. The beam reaching the surface of sub-pixels sp, sp' of pixel p2 has a diameter B2 smaller than diameter B1 and reaches peripheral sub-pixels sp of pixel p2 on a smaller surface area than peripheral sub-pixels sp of pixel p1.

By comparing the amount of light detected by central sub-pixel sp' with the amount of light detected by peripheral sub-pixels sp of each pixel, the diameter of the image formed by the object of the scene on the pixel, and thus the distance between this object and the image sensor, can be deduced.

Figures 5A, 5B:
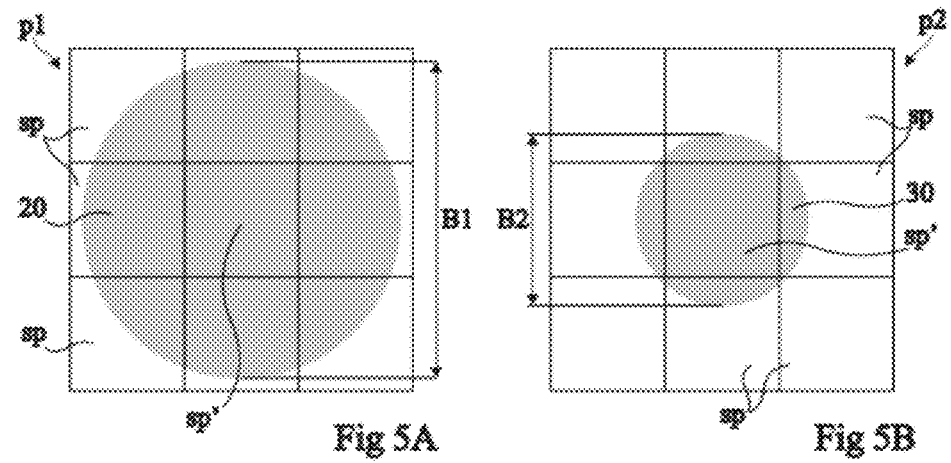
FIGS. 5A and 5B illustrate a result obtained by means of an image sensor according to an embodiment.

FIGS. 5A and 5B illustrate two pixels such as described hereabove, each comprising an assembly of nine sub-pixels sp, sp' (3×3 sub-pixels), and respectively corresponding to the lighting received in the case of the two pixels p1 and p2 of FIG. 4.

In the case of FIG. 5A, the object detected by pixel p1 forms a disk 20 on pixel p1 having a significant diameter B1. In this case, disk 20 is almost contained within pixel p1. In the case of FIG. 5B, the object detected by pixel p2 forms a disk 30 on this pixel having a smaller diameter B2 than disk 20.

To detect the size of the disk formed on a pixel, it is provided to compare the detection performed by a central sub-pixel sp' of the pixel with the detection performed by one or by all the sub-pixels sp located at the periphery of the central sub-pixel. Such a comparison, for example by calculating the ratio of these two detections, enables to do away with the value of the general lighting on the pixel. It is thus provided to associate a sensor comprising pixels formed of several sub-pixels with means for determining the ratio of the signals detected by the different pixels to obtain the value of the diameter of the disk detected by the pixel, and then correlate this value with the distance of the detected object.

The ratio between the detection of the central sub-pixel and that of the peripheral sub-pixels provides the diameter of the image formed on a pixel of the image sensor. This diameter may for example be compared with diameters stored in a database and associated with distances to reference objects. Advantageously, such a comparison, by means of adapted comparison means, consumes little time. Thus, the method provided herein is compatible with the real-time acquisition of data relative to distances of objects of a moving scene.

Means for calculating the distance to objects may also be provided rather than means of comparison with diameter-distance associations contained in a database. As an example, if the microlenses are placed in the focal plane of main microlens LENSE, if the diameter of the main lens is called $D_{LENSE}$ and its focal distance is called $f_L$, if the photosensitive areas are formed at the focal plane of microlenses µ1, the focal distance of the microlenses is called $f_\mu$ and the distance of an object in the scene to the object focal point of main lens LENSE is called $z_0$, diameter B of the image obtained on a pixel of the sensor complies with the following equation:

$$B = D_{LENSE} \times \frac{f_\mu \cdot z_0}{f_L(f_L - z_0)}.$$

Thus, the distance of an object to the main lens is defined by:

$$z_0 = \frac{f_L}{1 + \frac{D_{LENSE}}{f_L} \times \frac{f_\mu}{B}}$$

and can be easily calculated.

In order for the detection by a pixel array such as provided hereabove to be efficient for predefined object distance ranges, it will be within the abilities of those skilled in the art to readily determine the values of the distance between main lens LENSE of the sensor and microlenses µ11 and µ12, and between microlenses µ11 and µ12 and the photodetection areas of the sub-pixels (where the microlenses can be formed in a plane different from the focal plane of the main lens) so that a first minimum or maximum value of the distances to be detected corresponds to an illumination of a pixel such as that in FIG. 5A (maximum illumination) and that a second minimum or maximum value of the distances to be detected corresponds to an illumination of a pixel such as that in FIG. 5B, in which central pixel sp' is fully illuminated and the peripheral pixels are only slightly illuminated.

Thus, the positioning of the different sensor elements will be adjusted according to the ranges of distances to objects which are desired to be detected. For example, if a three-dimensional sensor detecting distances reaching infinity is desired to be formed, the microlenses may be formed in the focal plane of the main lens. Conversely, if shorter distances are desired to be detected, especially to detect a person's motions in the case of video games, the different elements may be adjusted differently.

Specific embodiments of the present invention have been described. Various alterations and modifications will occur to those skilled in the art. In particular, it may be provided to form pixels comprising more than nine sub-pixels, the illumination of each ring of sub-pixels surrounding the central sub-pixel enabling to detect a predetermined distance range.

Further, although the present invention has been described in relation with a back-side illuminated image sensor, it may also be provided to form pixels formed of an assembly of sub-pixels on any type of image sensor, for example, a front-side illuminated image sensor. The distance sensor provided herein is also compatible with any sub-pixel photosensitive area structure, and in particular with photosensitive cells, and their associated electronic, comprising single-photon avalanche diode (SPAD).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising:
an integrated image sensor comprising a pixel array formed by a plurality of pixels, wherein each pixel in the array is associated with a microlens and is formed of an assembly of sub-pixels, each sub-pixel having a photosensitive area,
wherein the device is configured to determine a ratio of an amount of photons detected by the photosensitive area of a central sub-pixel of each pixel to an amount of photons detected by the photosensitive area of at least one peripheral sub-pixel adjacent to the central sub-pixel and determine from the ratio a diameter of an image of an object, said diameter corresponding to a distance to the object.

2. The device of claim 1, wherein each pixel comprises at least one central sub-pixel and at least eight peripheral sub-pixels.

3. The device of claim 1, further comprising a main lens extending over a surface of the image sensor, the microlens positioned in a focal plane of the main lens, the photosensitive areas of the sub-pixels being provided in a focal plane of the microlens, wherein the device is configured to calculate a distance $z_0$ to an object in the scene by calculating the following ratio:

$$z_0 = \frac{f_L}{1 + \frac{D_{LENSE}}{f_L} \times \frac{f_\mu}{B}},$$

$D_{LENSE}$ being a diameter of the main lens, $f_L$ being a focal distance of the main lens, $f_\mu$ being a focal distance of the microlens, and B being the diameter of the image detected by the pixel.

4. The device of claim 3, wherein the device is further configured to compare the diameter of the image detected by each pixel with reference diameters stored in a database, each of the reference diameters associated with a corresponding reference distance.

5. The sensor of claim 1, wherein each of the sub-pixels comprises a single-photon avalanche diode.

6. A method for determining a distance to an object contained in a scene, the method comprising:
  determining a ratio between an amount of photons detected by a central sub-pixel and an amount of photons detected by one of a plurality of peripheral sub-pixels surrounding the central sub-pixel, the central sub-pixel and the peripheral sub-pixels forming a pixel in a pixel array;
  deducing, based, at least in part, on the ratio, a diameter of an image formed on the pixel; and
  associating the diameter of the image formed on the pixel with a distance to the object in the scene.

7. The method of claim 6, wherein associating the diameter of the image formed on the pixel with the distance to the object in the scene comprises comparing the diameter of the image formed on the pixel with diameters stored in a database.

8. The method of claim 6, wherein associating the diameter of the image formed on the pixel with the distance to the object in the scene comprises using the diameter of the image to calculate the distance to the object.

9. A method of using a pixel to determine a distance to an object, the pixel including first and second sub-pixels, the method comprising:
  performing a comparison of responses of the first and second sub-pixels to determine a ratio of light detection; and
  using the ratio to determine the distance to the object.

10. The method of claim 9, wherein said ratio is a ratio between an amount of light detected by the first sub-pixel and an amount of light detected by the second sub-pixel.

11. The method of claim 9, wherein using the ratio to determine the distance to the object comprises determining, based, at least in part, on the comparison, a size of an image of the object.

12. The method of claim 11, wherein the size of the image comprises a diameter of the image.

13. The method of claim 11, wherein using the ratio to determine the distance to the object further comprises comparing the size of the image of the object with reference image sizes, each of the reference image sizes corresponding to a reference distance.

14. The method of claim 11, wherein using the ratio to determine the distance to the object further comprises calculating the distance to the object, based, at least in part, on the size of the image of the object.

15. The method of claim 14, wherein the size of the image comprises a diameter of the image, and wherein calculating the distance $z_0$ to the object comprises calculating:

$$z_0 = \frac{f_L}{1 + \frac{D_{LENSE}}{f_L} \times \frac{f_\mu}{B}},$$

wherein $D_{LENSE}$ is a diameter of a main lens, wherein $f_L$ is a focal distance of the main lens, wherein $f_\mu$ is a focal distance of a microlens associated with the pixel, and wherein B is the diameter of the image.

16. The method of claim 9, wherein the pixel is associated with a microlens, and wherein photosensitive areas of the first and second sub-pixels are disposed in a focal plane of the microlens.

17. The method of claim 9, wherein the first sub-pixel is centrally disposed among sub-pixels included in the pixel, and wherein the second sub-pixel is peripherally disposed among the sub-pixels included in the pixel.

18. The method of claim 9, wherein the first sub-pixel comprises a single-photon avalanche diode.

19. A method of determining a distance to an object, the method comprising:
  determining a ratio of image responses of a first and a second photosensitive elements;
  determining, based on the determined ratio of image responses, a size of an image of the object, the image formed by the first and second photosensitive elements; and
  using the size of the image to determine a distance to the object.

20. The method of claim 19, wherein the ratio is a ratio between an amount of light detected by the first photosensitive element and an amount of light detected by the second photosensitive element.

21. The method of claim 19, wherein determining a size of the image comprises determining a diameter of the image.

22. The method of claim 19, wherein using the size of the image to determine the distance to the object comprises comparing the size of the image with reference image sizes, each of the reference image sizes corresponding to a distance.

23. The method of claim 19, wherein using the size of the image to determine the distance to the object comprises calculating the distance to the object, based, at least in part, on the size of the image of the object.

24. The method of claim 22, wherein the size of the image comprises a diameter of the image, wherein the first and second photosensitive elements are associated with a microlens, and wherein calculating the distance $z_0$ to the object comprises calculating:

$$z_0 = \frac{f_L}{1 + \frac{D_{LENSE}}{f_L} \times \frac{f_\mu}{B}},$$

wherein $D_{LENSE}$ is a diameter of a main lens, $f_L$ is a focal distance of the main lens, $f_\mu$ is a focal distance of the microlens, and B is the diameter of the image.

25. The method of claim 19, wherein the first and second photosensitive elements are associated with a microlens, and wherein photosensitive areas of the first and second photosensitive elements are disposed in a focal plane of the microlens.

26. The method of claim 25, wherein the first photosensitive element is centrally disposed among photosensitive elements associated with the microlens, and wherein the second photosensitive element is peripherally disposed among the photosensitive elements associated with the microlens.

27. The method of claim 19, wherein the first photosensitive element comprises a single-photon avalanche diode.

* * * * *